United States Patent [19]

Ishikawa et al.

[11] Patent Number: 4,504,573
[45] Date of Patent: Mar. 12, 1985

[54] PHOTOPOLYMERIZABLE COMPOSITIONS

[75] Inventors: Shun-ichi Ishikawa, Shizuoka; Teruo Nagano; Koji Tamoto, both of Kanagawa; Fumiaki Shinozaki, Shizuoka, all of Japan

[73] Assignee: Fuji Photo Film Co., Ltd., Kanagawa, Japan

[21] Appl. No.: 592,196

[22] Filed: Mar. 22, 1984

[30] Foreign Application Priority Data

Mar. 24, 1983 [JP] Japan .................................. 58/49308

[51] Int. Cl.³ .............................................. G03C 1/68
[52] U.S. Cl. ...................................... 430/288; 430/281; 430/915; 430/921; 430/920; 430/926; 204/159.24
[58] Field of Search ............... 430/915, 921, 920, 281, 430/288, 926; 204/159.24

[56] References Cited

U.S. PATENT DOCUMENTS 2,908,667 10/1959 Williams .............................. 430/294
4,272,609 6/1981 Klüpfel .............................. 430/920

FOREIGN PATENT DOCUMENTS 57-53747 3/1982 Japan .................................. 430/920

OTHER PUBLICATIONS

Badr et al., *Bulletin of the Chemical Society of Japan*, vol. 53, 1980, pp. 2389-2392.

*Primary Examiner*—John E. Kittle
*Assistant Examiner*—Cynthia Hamilton
*Attorney, Agent, or Firm*—Sughrue, Mion, Zinn, Macpeak & Seas

[57] ABSTRACT

A high sensitivity photopolymerizable composition is disclosed. The composition includes a polymerizable compound having an ethylenically unsaturated bond and a photopolymerizable initiator represented by the general formula (I).

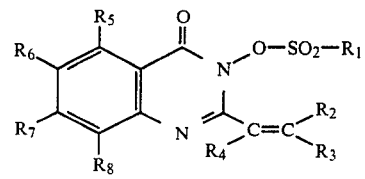

The substituents within general formula (I) are defined within the specification. The composition has improved sensitivity and the initiator provides an increased polymerization rate. The composition may further include Michler's ketone and a N-methyl-2-benzoyl-β-naphthothiazolin.

17 Claims, No Drawings

PHOTOPOLYMERIZABLE COMPOSITIONS

FIELD OF THE INVENTION

This invention relates to a photopolymerizable composition and more particularly to a photopolymerizable composition composed of a polymerizable compound having an ethylenically unsaturated bond, a photopolymerization initiator, and, if necessary, a binder and, if further necessary, a sensitizer. In particular, the invention relates to a photopolymerizable composition useful for forming layers of photosensitive printing plates, photoresists, etc.

BACKGROUND OF THE INVENTION

It is known at present to reproduce images by a photographic means using a photosensitive composition composed of a mixture of a polymerizable compound having an ethylenically unsaturated bond, a photopolymerization initiator, and, if necessary, a proper binder having a film-forming faculty and a thermopolymerization inhibitor. That is, as described in U.S. Pat. Nos. 2,927,002, 2,902,356 and 3,870,524, since such as photosensitive composition is hardened and insolubilized by the irradiation of light, a hardened image of a desired photosensitive composition can be formed by forming a proper film or layer of the photopolymerizable composition, light-irradiating the layer through a desired negative image, and then removing the layer of the photopolymerizable composition only at the unexposed areas, by a proper solvent. The photopolymerizable compositions of this type are, as a matter of course, very useful as materials for forming photosensitive printing plates, photoresists, etc.

A conventional polymerizable composition itself having an ethylenically unsaturated bond has an insufficient light-sensitivity. Accordingly, in order to increase the light sensitivity of the polymerizable composition, the addition of a photopolymerization initiator has been proposed. Examples of photopolymerization initiators used for this purpose include benzil, benzoin, benzoin ethyl ether, Michler's ketone, anthraquinone, acridine, phenazine, benzophenone, 2-ethylanthraquinone, etc. Photopolymerization initiator capable of providing a high light sensitivity include known quinazoline derivatives disclosed in Japanese Patent Application (OPI) No. 53747/82. (The term "OPI" indicates an unexamined published patent application open to public inspection). However, even when using these photopolymerization initiators, the inductivity of the photopolymerizable composition to hardening remains low and hence it requires a long time for image exposure when forming an image. Accordingly, there are problems such as when forming a precise image, an image having good quality is not reproduced if there is even slight vibration during operation, the amount of the energy radiation of a light source for exposure must be increased, which results in emitting a large amount of heat, and further the layer of the photopolymerizable composition is liable to deform or denature due to the heat.

SUMMARY OF THE INVENTION

An object of this invention is, therefore, to provide a photopolymerizable composition having high sensitivity.

Another object of this invention is to provide a photopolymerizable composition containing a polymerizable compound having an ethylenically unsaturated bond, said composition further containing a photopolymerization initiator capable of increasing the photopolymerization rate of the photopolymerizable composition.

As the result of various investigations for attaining the foregoing objects of this invention, the inventors have discovered that a specific polymerization initiator greatly increases the photopolymerization rate of a polymerizable compound having an ethylenically unsaturated bond and based on the discovery, the invention has been attained.

The foregoing objects of this invention can be attained by a photopolymerizable composition containing a polymerizable compound having an ethylenically unsaturated bond and at least one kind of a photopolymerization initiator shown by the general formula (I)

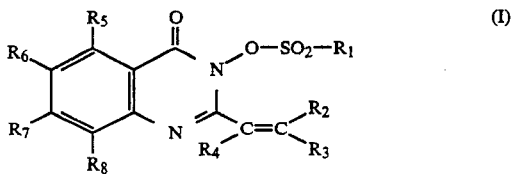

wherein $R_1$ represents an alkyl group, a substituted alkyl group, an aryl group, or a substituted aryl group; $R_2$ represents an alkyl group, a substituted alkyl group, an aryl group, a substituted aryl group, a heterocyclic ring, or a substituted heterocyclic ring; $R_3$ represents a hydrogen atom, an alkyl group, a substituted alkyl group, an aryl group, or a substituted aryl group; $R_4$ represents a hydrogen atom, an alkyl group, a substituted alkyl group, an aryl group, a substituted aryl group, a cyano group, a halogen atom, an alkoxy group, or an alkoxycarbonyl group; and $R_5$, $R_6$, $R_7$, and $R_8$ each represents a hydrogen atom, an alkyl group, a substituted alkyl group, an aryl group, a substituted aryl group, a halogen atom, or an alkoxy group; said $R_5$ and $R_6$, said $R_6$ and $R_7$, and said $R_7$ and $R_8$ may combine with each other to form a benzene ring.

DETAILED DESCRIPTION OF THE INVENTION

The polymerizable compound having an ethylenically unsaturated bond used in the composition of this invention is a compound having at least one ethylenically unsaturated bond in the chemical structure thereof and has a chemical form of a monomer, a prepolymer (i.e., a dimer, a trimer, and other oligomers), a mixture or a copolymer of them. Examples of the compound include unsaturated carboxylic acids, salts of unsaturated carboxylic acids, esters of unsaturated carboxylic acids and aliphatic polyhydric alcohols, amides of unsaturated carboxylic acids and aliphatic polyvalent amine compounds, etc.

Practical examples of unsaturated carboxylic acids used as the foregoing compounds in this invention include acrylic acid, methacrylic acid, itaconic acid, crotonic acid, isocrotonic acid, maleic acid, etc.

Examples of salts of unsaturated carboxylic acids include sodium salts and potassium salts of the aforesaid unsaturated carboxylic acids.

Practical examples of the esters of unsaturated carboxylic acids and aliphatic polyhydric alcohols include acrylic acid esters such as ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, sorbitol triacrylate, sorbitol tetraacrylate, sorbitol pentaacrylate, sorbitol hexaacrylate, polyester acrylate oligomer, etc.; methacrylic acid esters such as tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis-[p-(3-methacryloxy-2-hydroxypropoxy)phenyl]dimethylmethane, bis-[p-(acryloxyethoxy)phenyl]dimethylmethane, etc.; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.; crotinic acid esters such as ethylene glycol dicrotonate, tetramethylene glycol dicrotonate, pentaerythritol dicrotonate, sorbitol tetracrotonate, etc.; isocrotonic acids esters such as ethylene glycol diisocrotonate, pentaerythritol diisocrotonate, sorbitol tetraisocrotonate, etc.; maleic acid esters such as ethylene glycol dimaleate, triethylene glycol dimaleate, pentaerythritol dimaleate, sorbitol tetramaleate, etc.

The foregoing esters may be used solely or as a mixture of them.

Practical examples of the amides of unsaturated carboxylic acids and aliphatic polyvalent amine compounds include methylene bis-acrylamide, methylene bis-methacrylamide, 1,6-hexamethylene bis-acrylamide, 1,6-hexamethylene bis-methacrylamide, diethylenetriamine trisacrylamide, xylylene bis-acrylamide, xylylene bis-methacrylamide, etc.

Other examples of useful polymerizable compounds having an ethylenically unsaturated bond include vinylurethane compounds each having at least two polymerizable vinyl groups in one molecule prepared by an addition reaction of the vinyl monomer having a hydroxy group shown by the following general formula (II) to a polyisocyanate compound having at least two isocyanates in one molecule;

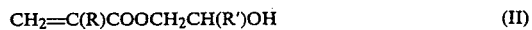

wherein R and R' each represents H or CH<sub>3</sub>.

The photopolymerization initiator which is a remarkable feature in the photopolymerizable composition of this invention is explained below.

The photopolymerization initiator shown by the foregoing general formula (I), which is used in this invention, can be prepared by subjecting a 2-substituted-3-hydroxy-4(3H)-quinazolinone derivative shown by general formula (III)

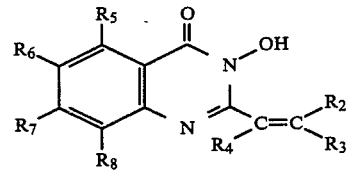

wherein $R_2$, $R_3$, $R_4$, $R_5$, $R_6$, $R_7$, and $R_8$ have the same significance as in general formula (I) [prepared according to the method described in D. Harrison et al., "Journal of the Chemical Society", 2157–2160 (1960)] and an organic sulfonic acid chloride shown by the formula $R_1$—$SO_2$—Cl (wherein $R_1$ has the same significance as in general formula (I)) to a dehydrochlorination condensation reaction in the presence of a dehydrochlorinating agent. This reaction proceeds in either an aqueous solvent or an organic solvent if a hydrochlorinating agent exists in the reaction system. When performing the reaction in an aqueous solvent, lithium hydroxide, sodium hydroxide, potassium hydroxide, sodium carbonate, potassium carbonate, etc., are suitable for the dehydrochlorinating agent. When performing the reaction in an organic solvent, organic solvents having no OH group, such as diethyl ether, diisopropyl ether, acetone, dichloromethane, chloroform, carbon tetrachloride, tetrahydrofuran, dioxane, ethyl acetate, benzene, toluene, acetonitrile, etc., are suitable for the organic solvent and also pyridine, diethylamine, triethylamine, N,N-dimethylaniline, N,N-diethylaniline, etc., are preferred as the dehydrochlorinating agent. It is preferred to preform the reaction using 1 to 3 equivalents of the organic sulfonic acid chloride and 1 to 5 equivalents of the dehydrochlorinating agent per equivalent of the compound shown by general formula (III) and the reaction temperature is preferably 0° C. to 40° C.

The alkyl group of $R_1$ in general formula (I) is a straight chain alkyl, a branched chain alkyl, or a cyclic alkyl but is preferably a straight chain alkyl. The alkyl is more preferably a straight chain alkyl having 1 to 8 carbon atoms, such as a methyl group, an ethyl group, a butyl group, a hexyl group, an octyl group, etc. The substituent of the substituted alkyl group of $R_1$ is, for example, a halogen atom such as a chlorine atom, etc., or an alkoxy group having 1 to 2 carbon atoms, such as a methoxy group, etc. Practical examples of the substituted alkyl group are a 2-chloroethyl group, a 2-methoxyethyl group, etc. The aryl group of $R_1$ is preferably a monocyclic or dicyclic aryl group containing 6 to 12 carbon atoms and includes, for example, a phenyl group, an α-naphthyl group, a β-naphthyl group, etc. The substituent of the substituted aryl group of $R_1$ is an alkyl group having 1 to 2 carbon atoms, such as a methyl group, an ethyl group, etc.; an alkoxy group having 1 to 2 carbon atoms, such as a methoxy group, an ethoxy group, etc.; or a halogen atom such as a chlorine atom, etc. Practical examples of the substituted aryl group include a methylphenyl group, a dimethylphenyl group, a methoxyphenyl group, a chlorophenyl group, a methoxynaphthyl group, etc.

The alkyl group, substituted alkyl group, aryl group, and substituted aryl group of $R_2$ in general formula (I) may be the same as those of $R_1$. The heterocyclic ring of $R_2$ is preferably a monocyclic ring, more preferably a monocyclic ring containing O or S as a hetero-atom such as, for example, a furan ring, a thiophene, etc. The substituent of the substituted heterocyclic ring of $R_2$ is an alkyl group having 1 to 2 carbon atoms, such as a methyl group, an ethyl group, etc.; an alkoxy group having 1 to 2 carbon atoms, such as a methoxy group, an ethoxy group, etc.; or a halogen atom such as a chlorine atom, etc. Practical examples of the substituted heterocyclic ring include a methylfuran ring, methoxyfuran ring, a chlorofuran ring, etc.

$R_3$ in general formula (I) represents a hydrogen atom, an alkyl group, a substituted alkyl group, an aryl group, a substituted aryl group. The alkyl group, substituted alkyl group, aryl group and substituted aryl group of $R_3$ are the same as those of $R_1$.

$R_4$ in general formula (I) represents a hydrogen atom, an alkyl group, a substituted alkyl group, an aryl group, a substituted aryl group, a cyano group, a halogen atom, an alkoxy group, or an alkoxycarbonyl group. The alkyl group, substituted alkyl group, aryl group, and substituted aryl group of $R_4$ are the same as those of $R_1$. Examples of the halogen atom of $R_4$ include a fluorine atom, a chlorine atom, a bromine atom, etc. The alkoxy group of $R_4$ is an alkoxy group having 1 to 2 carbon atoms, such as a methoxy group, an ethoxy group, etc. Also, the alkoxycarbonyl group of $R_4$ is an alkoxycarbonyl group having 1 to 2 carbon atoms, such as a methoxycarbonyl group, an ethoxycarbonyl group, etc.

In general formula (I), $R_5$, $R_6$, $R_7$, and $R_8$ each represents a hydrogen atom, an alkyl group, a substituted alkyl group, an aryl group, a substituted aryl group, a halogen atom, or an alkoxy group. The alkyl group is preferably an alkyl group having 1 to 2 carbon atoms, such as a methyl group, an ethyl group, etc. The substituent of the substituted alkyl group of $R_5$, $R_6$, $R_7$, and $R_8$ is a halogen atom such as a chlorine atom, etc. or an alkoxy group having 1 to 2 carbon atoms, such as a methoxy group, an ethoxy group, etc. Examples of the substituted alkyl group include a 2-chloroethyl group and a 2-methoxyethyl group, etc. The aryl group of $R_5$, $R_6$, $R_7$ and $R_8$ generally includes 6 to 12 carbon atoms and is preferably monocyclic ring such as a phenyl group. The substituent of the substituted aryl group includes an alkyl group having 1 to 2 carbon atoms such as a methyl group and an ethyl group, an alkoxy group having 1 to 2 carbon atoms, such as a methoxy group and an ethoxy group or a halogen atom such as a chlorine atom. Examples of the substituted aryl group are a methylphenyl group, a dimethylphenyl group, a methoxyphenyl group, a chlorophenyl group, etc. Examples of the halogen atom of $R_5$, $R_6$, $R_7$, and $R_8$ are a fluorine atom, a chlorine atom, a bromine atom, etc., and also the alkoxy group is preferably an alkoxy group having 1 to 2 carbon atoms such as a methoxy group, an ethoxy group, etc. Said $R_5$ and $R_6$, said $R_6$ and $R_7$, or said $R_7$ and $R_8$ may combine with each other to form a benzene ring.

The compounds having the following structures are particularly useful as the photopolymerization initiators used in this invention.

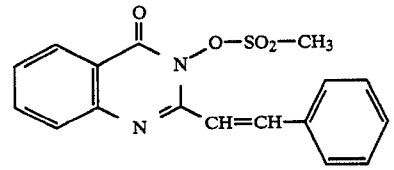

No. 1

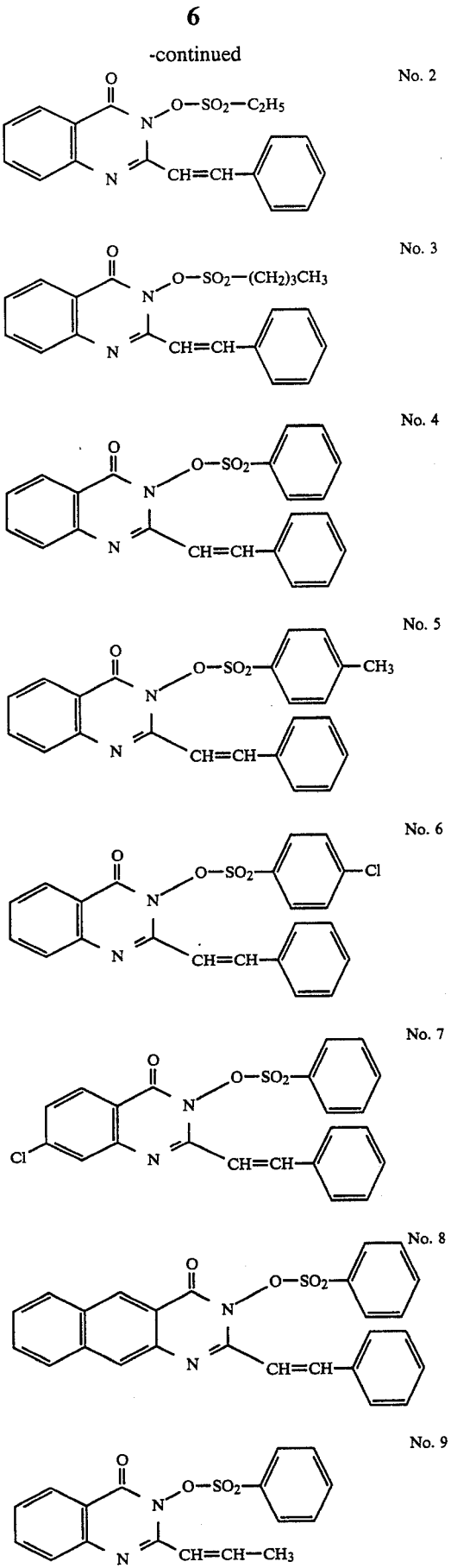

-continued

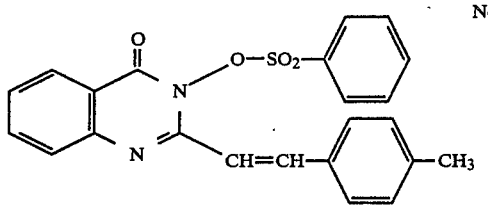
No. 10

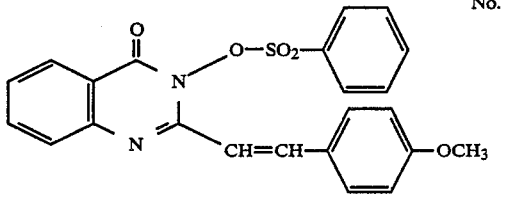
No. 11

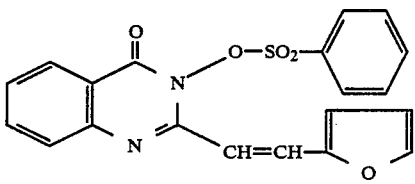
No. 12

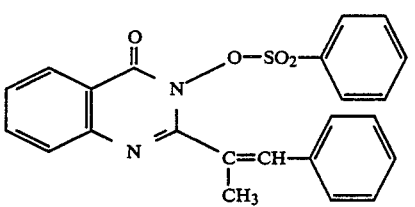
No. 13

For the photopolymerizable composition of this invention, it is preferred to use a binder in addition to the foregoing polymerizable compound and polymerization initiator.

The binder used in this invention must be compatible with the polymerizable ethylenically unsaturated compound and the photopolymerization initiator in order to prevent separation of them during production of the light-sensitive material. The binder must prevent separation of these components from the time of preparation of the coating liquid compositions to coating and drying the coated layer or layers. The layer containing the binder must be developed after image exposure as a light-sensitive layer or a resist layer by a solution development or a peel off development. Further, the binder must form a tough layer as a light-sensitive layer or a resist layer. Usually, the binder is properly selected from linear organic polymers.

Practical examples of the binder used in this invention include homopolymers or copolymers obtained by a polymerization of a methacrylic or acrylic acid alkyl ester (alkyl group containing 1 to 10 carbon atoms), a vinyl chloride, a vinylidene chloride, a styrene, a butadiene, a vinyl acetate, an acrylonitrile, a α-methylstyrene or a mixture thereof, a halogenated polyethylene, a halogenated polystyrene, a polyamide, an alkyl cellulose, an acetyl cellulose, a polyvinyl alcohol, a polyvinyl formal, a polyvinyl butyral, and preferably include chlorinated polyethylene, chlorinated polypropylene, polyacrylic acid alkyl esters (examples of the alkyl group are methyl group, ethyl group, n-butyl group, iso-butyl group, n-hexyl group, 2-ethylhexyl group, etc.), copolymers of an acryl acid alkyl ester (the alkyl group is same as above) and at least one of monomers such as acrylonitrile, vinyl chloride, vinylidene chloride, styrene, butadiene, etc.; polyvinyl chloride, a copolymer of vinyl chloride and acrylonitrile, polyvinylidene chloride, a copolymer of vinylidene chloride and acrylonitrile, polyvinyl acetate, polyvinyl alcohol, polyacrylonitrile, a copolymer of acrylonitrile and styrene, a copolymer of acrylonitrile, butadiene, and styrene, polymethacrylic acid alkyl esters (examples of the alkyl group are methyl group, ethyl group, n-propyl group, b-butyl group, iso-butyl group, n-hexyl group, cyclohexyl group, 2-ethylhexyl group, etc.), a copolymer of a methacrylic acid alkyl ester (the alkyl is same as above) and at least one of monomers such as acrylonitrile, vinyl chloride, vinylidene chloride, styrene, butadiene, etc., polystyrene, poly-α-methylstyrene, polyamides (e.g., 6-nylon, 6,6-nylon, etc.), methyl cellulose, ethyl cellulose, acetyl cellulose, polyvinyl formal, polyvinyl butyral, etc.

Furthermore, when an organic high-molecular polymer soluble in water or an alkaline aqueous solution is used, the development can be performed using water or an alkaline aqueous solution. Examples of such high-molecular polymers include addition polymers having a carboxylic acid at the side chain, such as methacrylic acid copolymers (e.g., a copolymer of methyl methacrylate and methacrylic acid, a copolymer of ethyl methacrylate and methacrylic acid, a copolymer of butyl methacrylate and methacrylic acid, a copolymer of ethyl acrylate and methacrylic acid, a copolymer of methacrylic acid and styrene, and a copolymer of methacrylic acid and benzyl methacrylate), methacrylic acid copolymers (e.g., a copolymer of ethyl acrylate and acrylic acid, a copolymer of butyl acrylate and acrylic acid, a copolymer of ethyl acrylate, styrene, and acrylic acid, etc.), an itaconic acid copolymer, a crotonic acid copolymer, and a partially esterified maleic acid copolymer. Other examples of the foregoing high-molecular polymers are acid cellulose derivatives having a carboxylic acid on their side chain.

These high molecular polymers may be used alone or in a various combination of two or more kinds of high molecular polymers having compatibility with each other. Such combination are possible to the extent that they do not cause any separation during the production steps of the light-sensitive material.

The molecular weight of the high molecular polymer used in this invention as the binder can be selected over a wide range depending on the type of polymer but is generally 5,000 to 2,000,000, preferably 10,000 to 1,000,000.

The photopolymerization composition of this invention may further contain a sensitizer in addition of the polymerizable compound having an ethylenically unsaturated bond and the photopolymerization initiator.

Practical examples of the sensitizer are benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzil, dibenzalacetone, p-(dimethylamino)phenylstyryl ketone, p-(dimethylamino)phenyl p-methylstyryl ketone, benzophenone, p-(dimethylamino)benzophenone (or Michler's ketone), p-(diethylamino)benzophenone, benzanthrone, etc. Among these sensitizers, Michler's ketone is particularly preferred.

Other preferred sensitizers used in this invention are the compounds shown by the following general formula (IV) described in Japanese Patent Publication No. 48516/76 corresponding to U.S. Pat. No. 3,870,524.

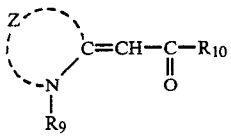

wherein $R_9$ represents an alkyl group containing 1 to 4 carbon atoms (e.g., a methyl group, an ethyl group, a propyl group, etc.), or a substituted alkyl group having a hydroxy group, a methoxy group, a carboxy group, etc., as a substituent (e.g., a 2-hydroxyethyl group, a 2-methoxyethyl group, a carboxymethyl group, a 2-carboxyethyl group, etc.); $R_{10}$ represents an alkyl group containing 1 to 4 carbon atoms (e.g., a methyl group, an ethyl group, etc.), an aryl group containing 6 to 12 carbon atoms (e.g., a phenyl group, a naphthyl group, etc.), a substituted aryl group having an alkyl group having 1 to 4 carbon atoms, or a hydroxy group as a substituent (e.g., a p-hydroxyphenyl group, etc.), or a heterocyclic compound containing O or S atom as a hetero atom (e.g., a thienyl group, etc.); and Z represents a nonmetallic atomic group necessary for forming a nitrogen-containing heterocyclic nucleus usually used for cyanine dyes, etc., such as, for example, benzothiazoles (e.g., benzothiazole, 5-chlorobenzothiazole, 6-chlorobenzothiazole, etc.), naphthothiazoles (e.g., α-naphthothiazole, β-naphthothiazole, etc.), benzoselenazoles (e.g., a benzoselenazole, 5-chlorobenzoselenazole, 6-methoxybenzoselenazole, etc.), naphthoselenazoles (e.g., α-naphthoselenazole, β-naphthoselenazole, etc.), benzoxazoles (e.g., benzoxazole, 5-methylbenzoxazole, 5-phenylbenzoxazole, etc.), naphthoxazoles (e.g., α-naphthoxazole, β-naphthoxazole, etc.), etc.

Practical examples of the compound shown by general formula (IV) have many chemical structures composed of various combinations of the foregoing Z, $R_9$, and $R_{10}$ and many of those compounds are known. Accordingly, the sensitizers used in this invention may be properly selected from these known materials.

Furthermore, merocyanine dyes can also be used as the preferred sensitizers in this invention. Examples of particularly useful merocyanine dyes used in this invention are shown below.

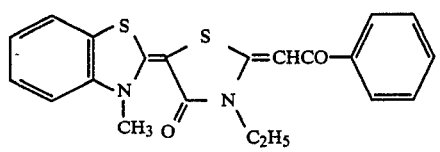

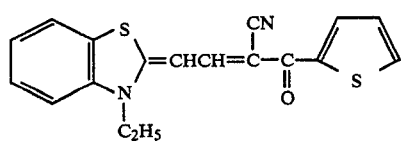

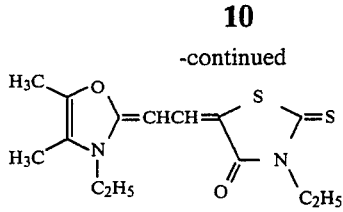

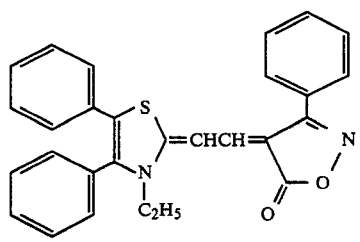

It is preferred to incorporate a thermal polymerization preventing agent in the polymerizable composition of this invention for preventing the occurrence of unnecessary thermal polymerization of the polymerizable compound having an ethylenically unsaturated bond in the composition during the production or preservation of the composition. Proper examples of the thermal polymerization preventing agent used in this invention for the aforesaid purpose are hydroquinone, p-methoxyphenol, di-t-butyl-p-cresol, pyrogallol, t-butylcatechol, benzoquinone, cuprous, chloride, phenothiazine, chloranil, naphtylamine, β-naphthol, nitrobenzene, dinitrobenzene, etc.

As the case may be, the polymerizable composition of this invention may further contain dyes or pigments such as Methylene Blue, Crystal Violet, Rhodamine B, Fuchsine, Auramine, azo-dyes, anthraquinone dyes, titanium oxide, carbon black, iron oxide, phthalocyanine pigments, azo-pigments, etc., for the purpose of coloring.

Moreover, the polymerizable compositions of this invention may further contain, if necessary, plasticizers. Examples of the plasticizers used in this invention include phthalic acid esters such as dimethyl phthalate, diethyl phthalate, dibutyl phthalate, dihexyl phthalate, dicyclohexyl phthalate, ditridecyl phthalate, etc.; glycol esters such as dimethyl glycol phthalate, ethylphthalylethyl glycolate, butylphthalylbutyl glycolate, etc.; phosphoric acid esters such as tricresyl phosphate, triphenyl phosphate, etc.; and aliphatic dibasic acid esters such as diisobutyl adipate, dioctyl adipate, dibutyl adipate, dibutyl sebacate, dibutyl maleate, etc.

The photopolymerizable composition of this invention is coated on a proper support by a desired coating method as a coating liquid using a proper solvent. The preferred ratio of each component constituting the photopolymerizable composition of this invention in the case of preparing the coating liquid is shown in the following table by weight part to 100 parts by weight of the polymerizable compound having an ethylenically unsaturated bond.

|  | Preferred range | (Particularly preferred range) |
| --- | --- | --- |
| Photopolymerizable initiator | 0.01–50 wt part | (0.1–10 wt part) |
| Binder | 0–1,000 wt part | (0–500 wt part) |
| Sensitizer | 0–100 wt part | (0–20 wt part) |
| Thermal polymerization preventing | 0–10 wt part | (0–5 wt part) |

| | Preferred range | (Particularly preferred range) |
|---|---|---|
| agent | | |
| Dye or pigment | 0–50 wt part | (0–20 wt part) |
| Plasticizer | 0–200 wt part | (0–50 wt part) |

Examples of solvents used for coating the photopolymerizable composition of this invention include ethylene dichloride, cyclohexanone, methyl ethyl ketone, methylcellosolve, ethylcellosolve, methylcellosolve, acetate, monochlorobenzene, toluene, xylene, ethyl acetate, butyl acetate, etc. These solvents may be used solely or as a mixture thereof.

In the case of preparing a photosensitive lithographic printing plate using the photopolymerizable composition of this invention, the proper coating amount of the composition is 0.1 to 10.0 g/m², preferably 0.5 to 5.0 g/m² as a solid.

The photopolymerizable composition of this invention is suitable for the photosensitive layer of a photosensitive lithographic printing plate. Useful supports for the photosensitive printing plate include an aluminum plate subjected to a hydrophilic treatment such as a silicate-treated aluminum plate, an anodically oxidized aluminum plate, and a silicate-electrodeposited aluminum plate. Other useful supports include a zinc plate, a stainless steel plate, a chromium-treated copper plate, and a plastic film and a paper subjected to a hydrophilic treatment.

Also, when using the photopolymerizable composition of this invention as a photoresist, a copper plate, a copper-plated plate, a stainless steel plate, a glass sheet, etc., can be used as the support.

A synthesis example for the photopolymerization initiators used in this invention and examples of this invention are shown below but the invention is not limited to these examples.

SYNTHESIS EXAMPLE

Synthesis of photopolymerization initiator No. 10

To 50 ml of tetrahydrofuran were added 30.2 g (0.2 mole) of methyl anthranilate and 22.3 g (0.2 mole) of triethylamine as a deoxidizing agent and after adding thereto 36.7 g (0.22 mole) of p-methylbenzoic acid chloride, the resultant mixture was stirred for one day at room temperature to provide an amide compound (10-1) having the following structure:

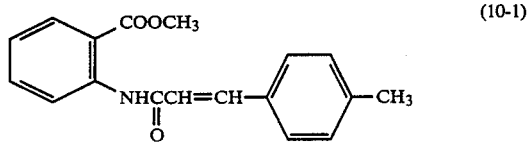

(10-1)

To a one liter three-neck flask were added 24 g (0.081 mole) of the amide compound (10-1) and 400 ml of methanol and the mixture was stirred by means of a mechanical stirrer. Then, a solution of 16.9 g (0.24 mole) of hydroxylamine and 19.4 g (0.48 mole) of excessive sodium hydroxide in 120 ml of water was added dropwise to the mixture in the three neck flask using a dropping funnel at room temperature. The reaction system immediately yellowed and the mixture was further stirred for 4 hours. After the reaction was over, ethanol was distilled off and the residue was acidified by the addition of diluted hydrochloric acid. The reaction mixture was concentrated, crystals thus formed were collected by filtration using Buchner funnel, washed thoroughly with water until the washings became neutral, and dried to provide 20.6 g (91% in yield) of N-hydroxy compound (10-2) having the following structure:

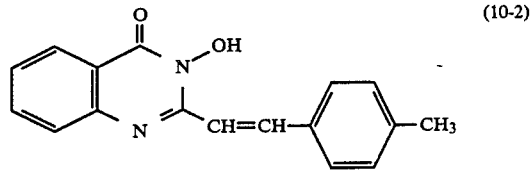

(10-2)

In 140 ml of tetrahydrofuran contained in a flask was dissolved 8.35 g (0.03 mole) of the N-hydroxy compound (10-2) followed by stirring and a solution of 3.78 g (0.033 mole) of benzenesulfonic acid chloride in 20 ml of tetrahydrofuran was added dropwise to the solution at room temperature. Thereafter, the flask was ice-cooled and a solution of 3.34 g (0.033 mole) of triethylamine as a base in 50 ml of tetrahydrofuran was added dropwise to the solution over a period of about 30 minutes. Thereafter, the resultant mixture was further stirred for about 2 hours. Then, triethylamine hydrochloride thus formed was filtered away and the filtrate was concentrated to provide an oily liquid. By adding 150 ml of ethanol to the oily liquid, 8.0 g (64% in yield) of the crystals of the photopolymerization initiator No. 10 having a melting point of 155°–156° C. (Büchi 510 melting point) were obtained.

Absorption wave length $\lambda_{max}$ was 345 nm (in tetrahydrofuran) and the absorption coefficient $\epsilon$ was $2.83 \times 10^4$.

EXAMPLES 1 TO 4

An aluminum plate of 0.24 mm in thickness, the surface of which was grained by means of a nylon brush and anodically oxidized, was coated with the photopolymerizable composition composed of the following components and dried for 2 minutes at 100° C. to provide a light-sensitive material.

| Components of photopolymerizable composition (solution): | |
|---|---|
| Pentaerythritol tetraacrylate | 40 g |
| Compound of general formula (I) | 4 g |
| Copolymer of benzyl methacrylate/methacrylic acid (73/27 in mole ratio) | 60 g |
| Triphenyl phosphate | 1 g |
| Methyl ethyl ketone | 400 ml |
| Methylcellosolve acetate | 300 ml |

A step wedge (density step difference of 0.15 and density step number of 15 steps) was placed on the photopolymerizable composition layer of the light-sensitive material, the layer was exposed to a metal halide lamp (0.5 KW) for one minute using a vacuum printing device, and after the light exposure, the light-sensitive material was developed using a developer having the following formula:

| Developer: | |
|---|---|
| Anhydrous sodium carbonate | 10 g |
| Butylcellusolve | 5 g |

-continued

| Developer: | |
|---|---|
| Water | 1 liter |

By the development, the photopolymerizable composition layer was dissolved off at the portions corresponding to the wedge steps of less exposure amount to disclose the aluminum surface and hence the highest step number corresponding to the step wedge remaining was employed as the sensitivity of the light-sensitive material.

The kinds of the compounds of general formula (I) used for the foregoing photopolymerizable compositions of this invention and the maximum step number of the step wedge after developing the light-sensitive materials having the photopolymerizable compositions are shown in Table 1. In the table a higher step number means a higher sensitivity.

Also, by following the same procedure as when preparing the light-sensitive material of this invention except that the photopolymerizable initiator of general formula (I) was not used, comparison sample (1) was prepared and by following the same procedure as above except that the following known compounds Ex-1 and Ex-2 were each used in place of the photopolymerization initiator of general formula (I), comparison samples (2) and (3) were prepared. These comparison samples were also light-exposed and developed in the same manner as above and the sensitivities (the highest step numbers) of the comparison samples are shown in Table 1.

Compound Ex-1:

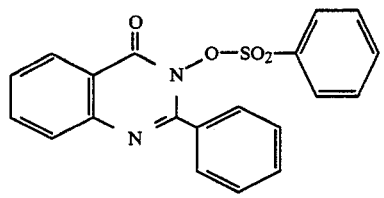

Compound Ex-2:

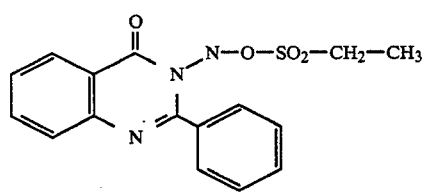

TABLE 1

| Sample No. | Compound of formula (I) | Highest step of of step wedge |
|---|---|---|
| Example 1 | No. 1 | 4 |
| Example 2 | No. 4 | 5 |
| Example 3 | No. 6 | 5 |
| Example 4 | No. 10 | 6 |
| Comparison Sample (1) | none | 0 |
| Comparison Sample (2) | Ex-1 | 1 |
| Comparison Sample (3) | Ex-2 | 1 |

As is clear from the results of Table 1, the light-sensitive materials using the photopolymerization initiators of general formula (I) are very excellent in sensitivity as compared to the light-sensitive material containing no photopolymerization initiator of general formula (I) and the light-sensitive materials containing the known photopolymerization initiators.

EXAMPLES 5 TO 10

Each of the photopolymerizable compositions composed of the following components was prepared by substituting Michler's ketone as a sensitizer for ½ of the compound of general formula (I) in each of the photopolymerizable compositions used for Examples 1 to 4 and light-sensitive materials were prepared as in Examples 1 to 4.

| Pentaerythritol tetraacrylate | 40 g |
|---|---|
| Compound of general formula (I) | 2 g |
| Michler's ketone (Me$_2$NC$_6$H$_4$)$_2$CO | 2 g |
| Copolymer of benzyl methacrylate/methacrylic acid (73/27 in mole ratio) | 60 g |
| Triphenyl phosphate | 1 g |
| Methyl ethyl ketone | 400 ml |
| Methylcellosolve acetate | 300 ml |

Each of the light-sensitive materials was exposed through a step wedge using a printer P-607, made by Dainippon Screen Mfg. Co., Ltd. and then developed using a developer having the same composition as in Examples 1 to 4. The kinds of the compounds of general formula (I) used and the sensitivities of the samples (the highest step numbers of the step wedge corresponding to the images thus formed) are shown in Table 2. Also, since Michler's ketone has not only a sensitizing effect but also a photopolymerization initiating effect, the sensitivity in the case of using 4 g of Michler's ketone in place of the compound of general formula (I) is also shown in Table 2 as comparison sample (4).

TABLE 2

| Sample No. | Compound of formula (I) | Highest step of of step wedge |
|---|---|---|
| Example 5 | No. 1 | 7 |
| Example 6 | No. 3 | 7 |
| Example 7 | No. 4 | 8 |
| Example 8 | No. 6 | 8 |
| Example 9 | No. 10 | 8 |
| Example 10 | No. 11 | 7 |
| Comparison Example (4) | none | 2 |

As shown in Table 2, the use of Michler's ketone together with the photopolymerization initiator of general formula (I) provides a composition of very high sensitivity which is substantially better than the results obtained with comparison sample (4) using Michler's ketone solely.

Also, as is understood by the comparison of Examples 1, 2, 3 and 4 with Examples 5, 7, 8 and 9, substituting Michler's ketone for a part of the compound of general formula (I) shows higher sensitivity than the case of using the compound of general formula (I) solely.

EXAMPLES 11 TO 16

By following the same procedure as in preparing the photopolymerizable compositions in Examples 5 to 10 except that 2 g of N-methyl-2-benzoyl-β-naphthothiazoline was used in place of Michler's ketone in the compositions, photopolymerizable compositions were prepared and light-sensitive materials were prepared as in Example 1 to 4 using the compositions.

Each of the light-sensitive materials was exposed through a step wedge using a printer P-607, made by Dainippon Screen Mfg. Co., Ltd. and then developed by the developer having the same composition as in Examples 1 to 4. The kinds of the compounds of general formula (I) used in the examples and the sensitivities of the light-sensitive materials (the highest step numbers of the step wedge corresponding to the images thus formed) are shown in Table 3.

Also, the sensitivity a material using 4 g of N-methyl-2-benzoyl-β-naphthothiazoline without using the compound of general formula (I) in the photopolymerizable composition is shown in Table 3 as comparison sample (5).

TABLE 3

| Sample No. | Compound of formula (I) | Highest step of of step wedge |
| --- | --- | --- |
| Example 11 | No. 1 | 11 |
| Example 12 | No. 3 | 11 |
| Example 13 | No. 4 | 12 |
| Example 14 | No. 6 | 11 |
| Example 15 | No. 10 | 12 |
| Example 16 | No. 11 | 12 |
| Comparison Example (5) | none | 6 |

As shown in Table 3, materials using N-methyl-2-benzoyl-β-naphthothiazoline and the photopolymerizable initiator shown by general formula (I) show a greatly increased sensitivity as compared to comparison sample (5) using N-methyl-2-benzoyl-β-naphthothiazolin solely. Also, from the comparison of Examples 1, 2, 3 and 4 with Examples 11, 13, 14 and 15, it is understood that substituting N-methyl-2-benzoyl-naphthothiazolin for a part of the compound of general formula (I) shows a high sensitivity as compared with using the compound of general formula (I) solely. Also, from the comparison of Examples 5 to 10 with Examples 11 to 16, it is understood that N-methyl-2-benzoyl-β-naphthothiazoline is better than Michler's ketone as the sensitizer.

EXAMPLES 17 TO 19

By following the same procedure as in preparing the photopolymerizable compositions in Examples 5 to 10 using 2 g of mercyanine dyes as sensitizers in place of Michler's ketone in the compositions, photopolymerizable compositions were prepared and light-sensitive materials were also prepared using these compositions as in Examples 1 to 4.

Each of the light-sensitive materials was exposed through a step wedge using a printer P-607, made by Dainippon Screen Mfg. Co., Ltd. and then developed by the developer having the same composition as in Examples 1 to 4. The highest step numbers of the step wedge corresponding to the images formed are shown in Table 4 as the sensitivities of the light-sensitive materials. Also, the sensitivities in the cases of 4 g of the merocyanine dye solely without using the compound of general formula (I) are shown in Table 4 as comparison samples (6) and (7). The merocyanine dyes are shown in the table by the same numbers as shown in the specification hereinbefore.

TABLE 4

| Sample No. | Compound of formula (I) | Merocyanine dye | Highest step no. of step wedge |
| --- | --- | --- | --- |
| Example 17 | No. 4 | M-1 | 7 |
| Example 18 | No. 4 | M-4 | 3 |
| Example 19 | No. 10 | M-1 | 7 |
| Comparison Example (6) | none | M-1 | 0 |
| Comparison Example (7) | none | M-4 | 0 |

As shown in Table 4, by using the compounds of general formula (I), the sensitivity of the light-sensitive materials is greatly increased as compared to the case of using the merocyanine dyes solely, i.e., the effect of this invention is confirmed. Also, by comparison of Examples 1 and 4 with Examples 17 and 19, it is understood that the case of substituting the merocyanine dye for a part of the compound of general formula (I) has a higher sensitivity than the case of using the compound of general formula (I) solely.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising a polymerizable compound having an ethylenically unsaturated bond and a photopolymerization initiator represented by general formula (I)

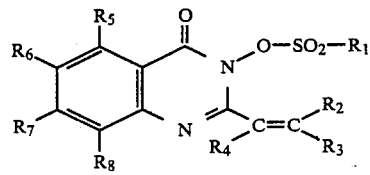

wherein $R_1$ represents an alkyl group, a substituted alkyl group, an aryl group, or a substituted aryl group; $R_2$ represents an alkyl group, a substituted alkyl group, an aryl group, a substituted aryl group, a heterocyclic ring, or a substituted heterocyclic ring; $R_3$ represents a hydrogen atom, an alkyl group, a substituted alkyl group, an aryl group, or a substituted aryl group; $R_4$ represents a hydrogen atom, an alkyl group, a substituted alkyl group, an aryl group, a substituted aryl group, a cyano group, a halogen atom, an alkoxy group, or an alkoxycarbonyl group; and $R_5$, $R_6$, $R_7$ and $R_8$ are independently a hydrogen atom, an alkyl group, or a substituted alkyl group, an aryl group, a substituted aryl group, a halogen atom, or an alkoxy group; or said $R_5$ and $R_6$, said $R_6$ and $R_7$, or said $R_7$ and $R_8$ are capable of combining with each other to form a benzene ring.

2. A photopolymerizable composition as claimed in claim 1, wherein the alkyl group and the alkyl groups for the substituted alkyl group represented by $R_1$, $R_2$, $R_3$ and $R_4$ contain 1 to 8 carbon atoms, the aryl group and the aryl groups for the substituted aryl group represented by $R_1$, $R_2$, $R_3$ and $R_4$ contain 6 to 12 carbon atoms.

3. A photopolymerizable composition as claimed in claim 1, wherein the alkyl group and the alkyl group for the substituted alkyl group represented by $R_5$, $R_6$, $R_7$ and $R_8$ contain 1 to 2 carbon atoms and the aryl group and the aryl group for the substituted aryl group represented by $R_5$, $R_6$, $R_7$ and $R_8$ contain 6 to 12 carbon atoms.

4. A photopolymerizable composition as claimed in claim 1, wherein the substituent for the substituted alkyl group of $R_1$, $R_2$, $R_3$ and $R_4$ is a halogen atom or an alkoxy group having 1 to 2 carbon atoms.

5. A photopolymerizable composition as claimed in claim 1, wherein the substituent for the substituted aryl group of $R_1$, $R_2$, $R_3$ and $R_4$ is an alkyl group having 1 to 2 carbon atoms, an alkoxy group having 1 to 2 carbon atoms or a halogen atom.

6. A photopolymerizable composition as claimed in claim 1, wherein the alkoxy group represented by $R_4$ and $R_5$ contains 1 to 2 carbon atoms and the alkoxycarbonyl group represented by $R_4$ contains 2 to 3 carbon atoms.

7. A photopolymerizable composition as claimed in claim 1, wherein the heterocyclic ring of $R_2$ is a monocyclic ring containing O or S as a hetero-atom and the substituent for the substituted heterocyclic ring of $R_2$ is an alkyl group having 1 to 2 carbon atoms or an alkoxy group having 1 to 2 carbon atoms.

8. A photopolymerizable composition as claimed in claim 1, wherein the $R_2$ of the initiator is a monocyclic ring.

9. A photopolymerizable composition as claimed in claim 1, wherein the $R_3$ of the initiator is an alkyl group.

10. A photopolymerizable composition as claimed in claim 1, wherein the $R_5$, $R_6$, $R_7$ and $R_8$ independently represent alkyl groups containing 1 to 2 carbon atoms.

11. A photopolymerizable composition as claimed in claim 1, wherein the polymerizable compound is a compound selected from the group consisting of unsaturated carboxylic acids, salts of unsaturated carboxylic acids, esters of unsaturated carboxylic acids and aliphatic polyhydric alcohols, amides of unsaturated carboxylic acids and aliphatic polyvalent amine compounds.

12. A photopolymerizable composition as claimed in claim 1, further comprising a sensitizer.

13. A photopolymerizable composition as claimed in claim 12 wherein, the sensitizer is a merocyanine dye.

14. A photopolymerizable composition as claimed in claim 12, wherein the sensitizer is Michler's ketone.

15. A photopolymerizable composition as claimed in claim 12, wherein the sensitizer is N-methyl-2-benzoyl-$\beta$-naphthothiazoline.

16. A photopolymerizable composition as claimed in claim 1, wherein the photopolymerization initiator is used in an amount of 0.01 to 50 parts by weight based on 100 parts by weight of the polymerizable compound.

17. A photopolymerizable composition as claimed in claim 1, wherein sensitizer is present in an amount of 0 to 100 parts by weight based on 100 parts by weight of the polymerizable compound.

* * * * *